United States Patent
Li

(10) Patent No.: US 6,240,042 B1
(45) Date of Patent: May 29, 2001

(54) OUTPUT CIRCUIT FOR A DOUBLE DATA RATE DYNAMIC RANDOM ACCESS MEMORY, DOUBLE DATA RATE DYNAMIC RANDOM ACCESS MEMORY, METHOD OF CLOCKING DATA OUT FROM A DOUBLE DATA RATE DYNAMIC RANDOM ACCESS MEMORY AND METHOD OF PROVIDING A DATA STROBE SIGNAL

(75) Inventor: Wen Li, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/389,531

(22) Filed: Sep. 2, 1999

(51) Int. Cl.$^7$ .................................................. G11C 8/00
(52) U.S. Cl. ................ 365/233; 365/230.02; 365/189.02
(58) Field of Search ............................... 365/233, 230.02, 365/189.02, 189.05

(56) References Cited

U.S. PATENT DOCUMENTS

| | | | |
|---|---|---|---|
| 5,831,929 | 11/1998 | Manning | 365/233 |
| 5,923,613 | 7/1999 | Tien et al. | 365/233 |
| 6,043,694 | * 3/2000 | Dortu | 327/156 |
| 6,052,329 | 4/2000 | Nishino et al. | 365/233 |
| 6,104,225 | * 8/2000 | Taguchi et al. | 327/298 |

FOREIGN PATENT DOCUMENTS

| | | |
|---|---|---|
| 198 21 641 A1 | 7/1999 | (DE) . |
| 11-213666 | 8/1999 | (JP) . |

OTHER PUBLICATIONS

Bruno W. Garlepp et al.; "A Portable Digital DLL for High–Speed CMOS Interface Circuits"; *IEEE Journal of Solid–State Circuits*, vol. 34, No. 5, May 1999; pp. 632–644.

Feng Lin et al.; "A Register–Controlled Symmetrical DLL for Double–Data Rate DRAM"; *IEEE Journal of Solid–State Circuits*, vol. 34, No. 4, Apr. 1999; pp. 565–568.

XP000862392 –A 2.5V 333Mb/s/pin 1Gb Double Data Rate SDRAM, Hongil Yoon et al., IEEE International Solid State Circuits Conference, vol. 42, Feb. 1999, pp. 412–413 and 486.

* cited by examiner

*Primary Examiner*—Vu A. Le
(74) *Attorney, Agent, or Firm*—Wells, St. John, Roberts, Gregory & Matkin PS

(57) ABSTRACT

A method and apparatus for synchronizing output data and data strobe signals uses internal interleaved clock signals in a double data rate (DDR) DRAM that are synchronized with an external clock. A delay-locked loop internal to the DDR DRAM is locked to an external clock signal and generates the internal interleaved clock signals. The internal interleaved clock signals are delay matched with the external clock signal as they propagate through timing circuitry coupled to latency and burst length selection signals. A data strobe signal is generated using clock signals from the delay-locked loop and is synchronized with the internal interleaved clock signals. The data strobe signal and the data are coupled via paths having comparable numbers and types of delay elements to provide output data and data strobe signals having predetermined delay relationships with the external clock signal.

24 Claims, 7 Drawing Sheets

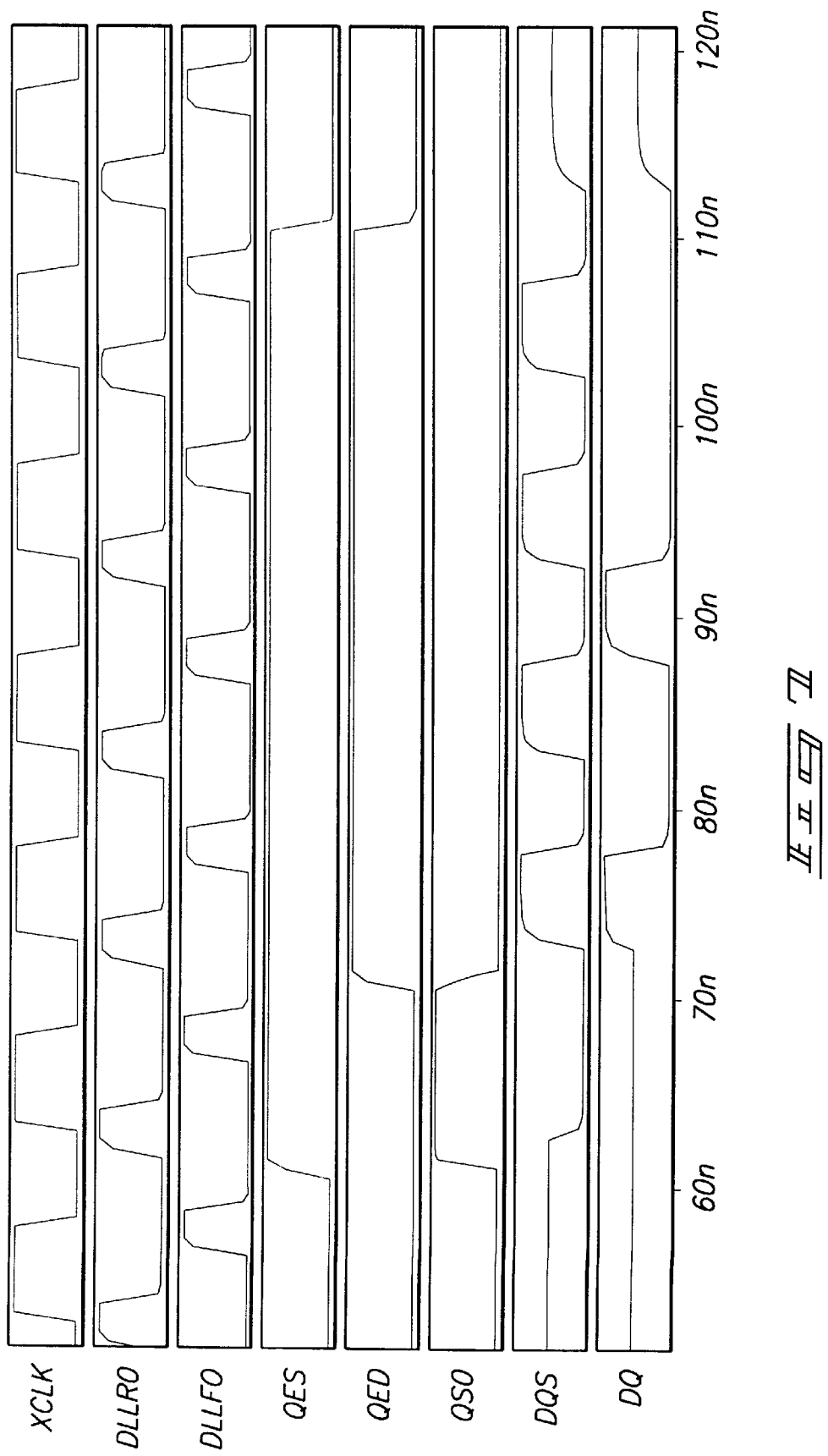

OUTPUT CIRCUIT FOR A DOUBLE DATA RATE DYNAMIC RANDOM ACCESS MEMORY, DOUBLE DATA RATE DYNAMIC RANDOM ACCESS MEMORY, METHOD OF CLOCKING DATA OUT FROM A DOUBLE DATA RATE DYNAMIC RANDOM ACCESS MEMORY AND METHOD OF PROVIDING A DATA STROBE SIGNAL

TECHNICAL FIELD

The invention pertains to an output circuit for a double data rate dynamic random access memory, a double data rate dynamic random access memory, a method of clocking data out from a double data rate dynamic random access memory and a method of providing a data strobe signal.

BACKGROUND OF THE INVENTION

It is frequently desired to read and write data from dynamic random access memories (DRAM) integrated circuits (ICs). As the amount of data stored in each memory IC increases, and as clock frequencies increase for devices exchanging data with memory ICs increases, there is increasing need to be able to read data out of the memory ICs with progressively higher bandwidth. This need is not easily met.

Previous generations of DRAM devices have included fast page mode DRAM and extended data output (EDO) DRAM. These DRAMs capture input data and drive output data at the falling edge of a column address strobe* (CAS*) signal, where the "*" indicates complement.

In synchronous DRAM (SDRAM), the data trigger point for read and write operations is the rising edge of the clock signal. These conventional DRAMs are referred to as single data-rate (SDR) DRAM devices. The peak bandwidth (megabytes/second) of a memory system using SDR DRAMs is given as:

$$\text{(memory system bus width)} \times \text{(clock frequency)} \quad \text{(Eq. 1)}$$

Obtaining a higher peak bandwidth from a SDR DRAM system requires making the clock as fast as possible and expanding the system bus width to be as wide as possible.

However, the clock driver has to drive all DRAMs in the memory system in parallel, which requires driving a capacitive load and includes synchronization requirements. Accordingly, higher clock speeds may be difficult to achieve in practice. Additionally, increasing the bus width also requires greater area on the circuit board holding the DRAM system. As a result, it is not easy to increase the peak bandwidth of a SDR DRAM system.

Double data rate (DDR) DRAM systems are a more attractive way to get a higher data rate and thus greater system bandwidth. In DDR DRAM systems, both the rising and falling edges of the clock signal or data strobe are trigger points for read and write operations. DDR DRAM systems thus provide double the peak data rate of comparable SDR DRAM systems using the same clock frequency, but require increased timing accuracy.

A differential clock (CLK and CLK*) scheme is used in DDR DRAM memory systems to address the increased timing accuracy requirements. However, there is still a need to synchronize internal clock signals with clocking signals in the circuitry external to the DDR DRAM. Further, because transitions in these clock signals at which data are transferred occur substantially more frequently than those of CAS* signals in SDR DRAMs, the timing tolerances are much tighter. As a result, there is need to develop new approaches to generating internal clocking signals CLK and CLK* and to synchronize these clock signals as well as output data with external clocking signals XCLK.

SUMMARY OF THE INVENTION

In one aspect, the invention includes an output circuit for a double data rate dynamic random access memory. The output circuit includes a delay-locked loop having an input configured to accept an external clock signal. The delay-locked loop provides first and second internal clock signals that are interleaved and are synchronized with the external clock signal. The output circuit also includes a data strobe circuit coupled to the delay-locked loop. The data strobe circuit provides a data strobe signal including a preamble. The data strobe circuit synchronizes the data strobe signal and preamble with the first and second internal clock signals.

In another aspect, the invention includes a double data rate dynamic random access memory (DDR DRAM) including such an output circuit.

In a further aspect, the present invention includes a method of clocking data out from a double data rate dynamic random access memory. The method includes providing a data enable signal after a failing edge of a first internal clock signal and prior to a rising edge of a second internal clock signal. The first and second internal clock signals are interleaved. The method also includes coupling first data from a first data array through first combinatorial logic in response to the data enable signal, clocking the first data through a first multiplexer with the first internal clocking signal, coupling second data from a second data array through second combinatorial logic in response to the data enable signal, clocking the second data through a second multiplexer with the second clocking signal, coupling the first and second data from the first and second multiplexers to a data buffer and providing a data strobe signal to a data strobe buffer. The data strobe signal is synchronized with the first and second data and with the external clock signal.

In another aspect, the present invention includes a method of providing a data strobe signal.

BRIEF DESCRIPTION OF THE DRAWINGS

Preferred embodiments of the invention are described below with reference to the following accompanying drawings.

FIG. 7 is a simplified timing diagram showing a latency two, burst length eight data output operation, in accordance with an embodiment of the present invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

The invention encompasses methods and apparatus for generating complementary clock signals internal to a DDR DRAM that are synchronized with external clock signals for data input and output. In particular embodiments, the invention encompasses methods and apparatus for equalizing delays between clocking signals derived from a delay-locked loop (DLL) internal to the DDR DRAM and the external clocking signal.

As will become apparent from the embodiments discussed below, one aspect of the invention comprises changing data output burst lengths, such as, for example, from a two-byte burst to a four- or eight-byte burst. Another aspect of the invention involves accommodating different data latencies. Data latency is defined herein to mean a delay, measured in clock cycles or fractions of clock cycles, between a time when a command requests specific data from the DRAM and a time when data read from the DRAM appears at the output. Such data burst length and latency changes are made using control signals that set multiplexers and clock systems to provide output signals with specific, predetermined delays and in specific, predetermined burst lengths.

Figure 1:
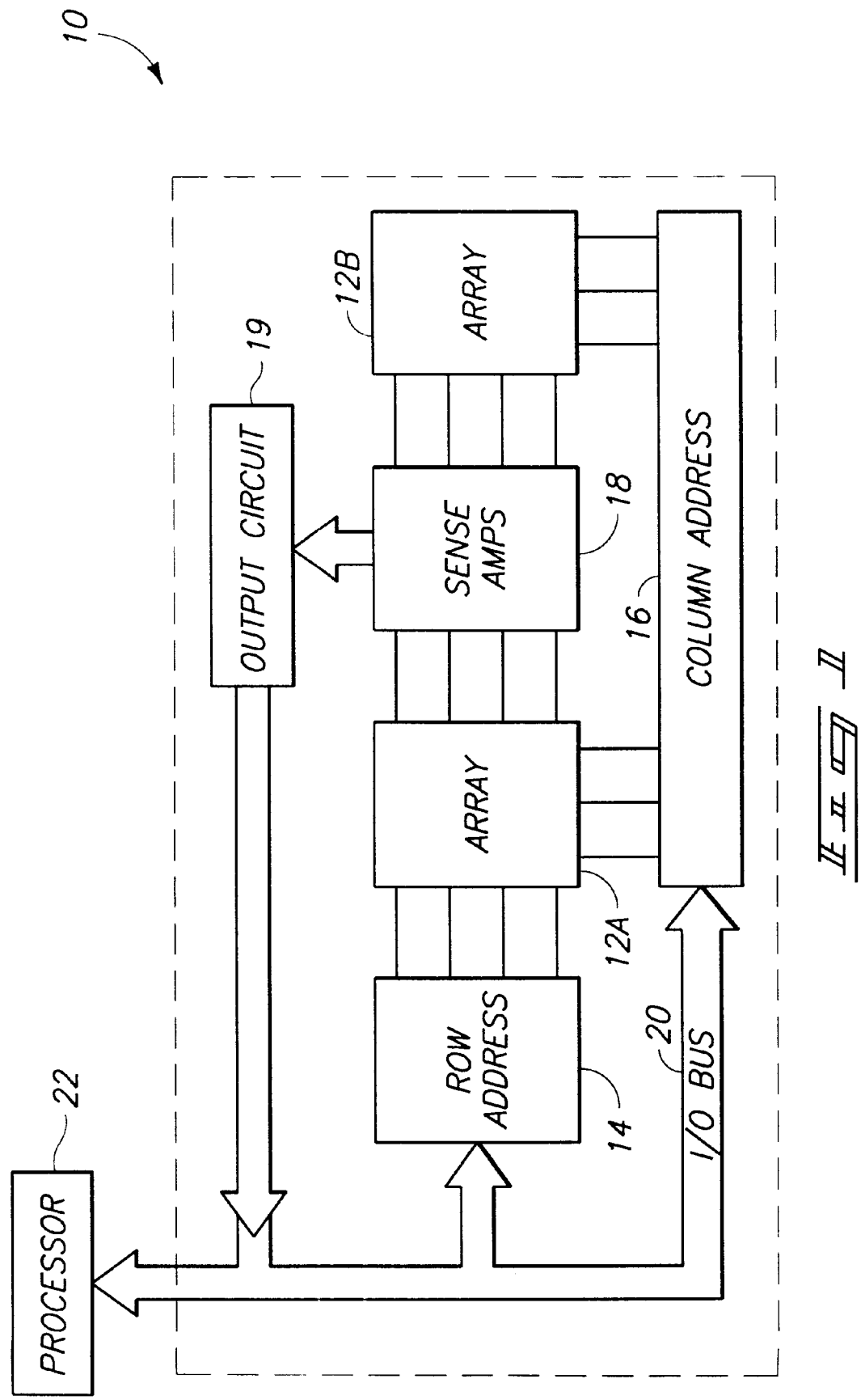
FIG. 1 shows a simplified block diagram of a DDR DRAM, in accordance with an embodiment of the present invention.

FIG. 1 is a simplified block diagram of a DDR DRAM 10, in accordance with an embodiment of the present invention. The DDR DRAM 10 includes arrays 12A and 12B of memory cells organized into rows and columns, a row addressing circuit 14, a column addressing circuit 16, sense amplifiers 18, output circuitry 19 and an I/O bus 20. The I/O bus 20 couples the memory arrays 12A and 12B to pins (not shown) of the DDR DRAM 10 and thus to a processor 22 such as a computer, microprocessor or other data processing device. In one embodiment, the I/O bus 20 is two bytes wide and operates at clock speeds up to 200 MHz, providing a data I/O bandwidth of 800 megabytes per second.

The processor 22 exchanges data with the arrays 12A and 12B by providing row addresses to the row address decoder 14 and the column address decoder 16, as well as commands to configure the DDR DRAM 10 for particular data exchange formats that are discussed in more detail below with respect to FIGS. 2–7. When the processor 22 is retrieving data from the arrays 12A and 12B, commands, addresses and the external clock signal XCLK are coupled from the processor 22 through the I/O bus 20 to the DDR DRAM 10. In response, the sense amplifiers 18 read data from the arrays 12A and 12B and couple the data to the output circuit 19. The output circuit 19 generates clocking and timing signals and uses these signals to synchronize coupling of the data from the sense amplifiers 18 to the processor 22 through the I/O bus 20.

Figure 2:
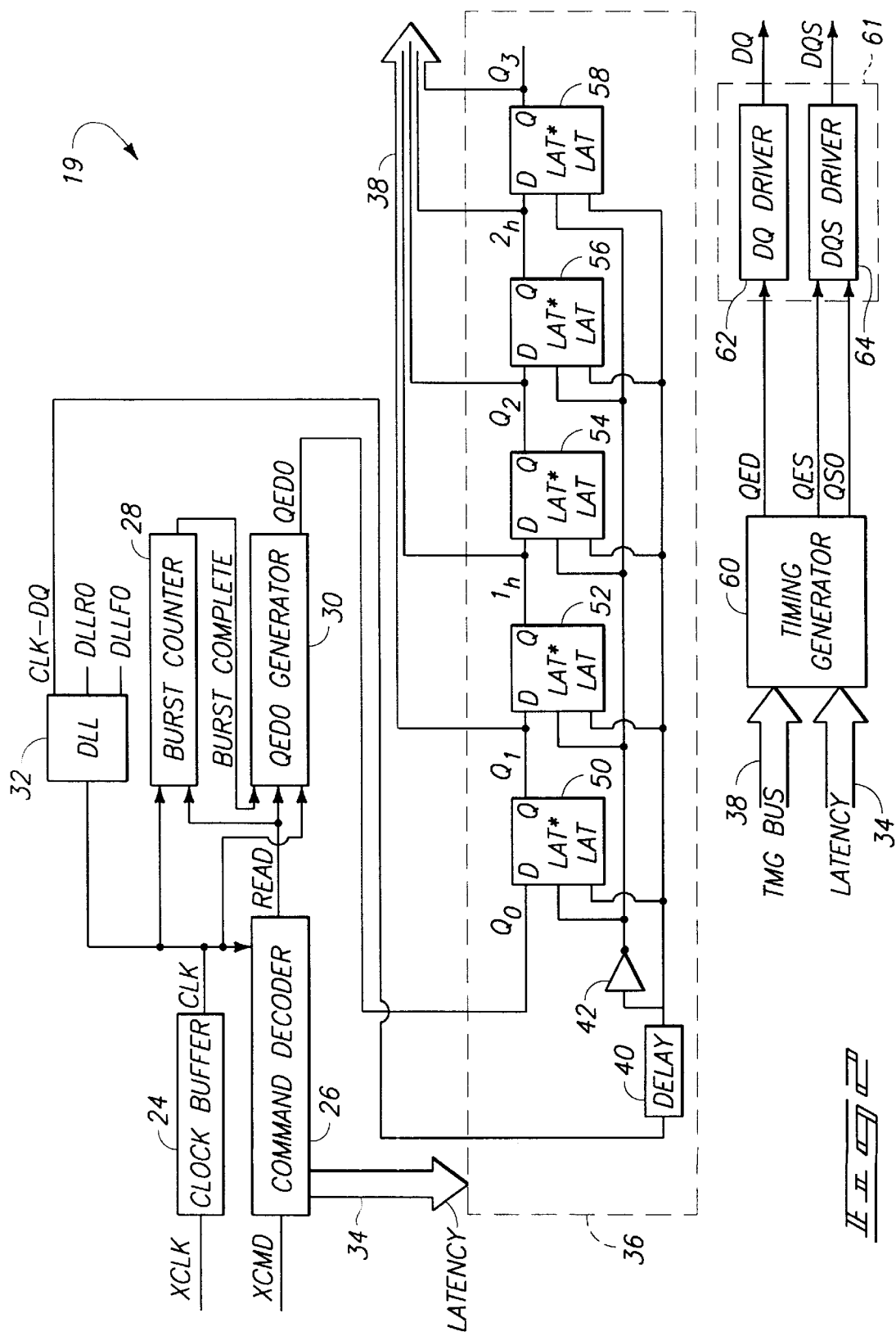
FIG. 2 is a simplified block diagram of the output circuit of the DDR DRAM of FIG. 1, in accordance with an embodiment of the present invention.

FIG. 2 is a simplified block diagram of the output circuit 19 of the DDR DRAM 10 of FIG. 1, in accordance with an embodiment of the present invention. The output circuit 19 includes a clock buffer circuit 24, a command decoder 26, a burst counter 28, a QED0 generator circuit 30 and a delay-locked loop 32. The external clock signal XCLK is coupled to an input to the clock buffer circuit 24. An internal clock signal CLK is derived from the external clock signal XCLK by the clock buffer circuit 24. The internal clock signal CLK is coupled to the command decoder 26, the burst counter 28, the QED0 generator circuit 30 and the delay-locked loop 32.

The delay-locked loop 32 has outputs CLK_DQ, DLLR0 and DLLF0. Operation of delay-locked loops is discussed in co-pending application Ser. No. 09/303,076, which is assigned to the assignee of the present application and which is hereby incorporated herein by reference.

Delay-locked loops are also discussed in "A Portable Digital DLL for High-Speed CMOS Interface Circuits," by B. W. Garlepp et al., IEEE JSSC, Vol. 34, No. 5, May 1999, pp. 632–644, which is hereby incorporated herein by reference. A delay-locked loop specifically designed for use in DDR DRAMs 10 is described in "A Register-Controlled Symmetrical DLL for Double-Data-Rate DRAM," by F. Lin et al., IEEE JSSC, Vol. 34, No. 4, Apr. 1999, pp. 565–568, which is hereby incorporated herein by reference.

The signals DLLR0, DLLF0 and CLK_DQ are all synchronized to have defined phase offsets from different portions of the external clock signal XCLK. As a result, the signals DLLR0, DLLF0 and CLK_DQ all have the same frequency as the external clock signal XCLK, and each of these signals also has a phase or delay relationship with the external clock signal XLCK that falls within a predetermined range that is specific to that particular signal.

The signals DLLR0 and DLLF0 are interleaved, that is, DLLR0 is at logic "1" only when DLLF0 is at logic "0" and DLLF0 is at logic "1" only when DLLR0 is at logic "0". Transitions from logic "1" to logic "0" may be, but need not be, temporally coincident for these two signals, with a result that it is possible for both signals to be at logic "0" simultaneously during a portion of a clock cycle. Rising edges of the signal DLLR0 precede or lead rising edges of the external clock signal XCLK by a predetermined amount. Rising edges of the signal DLLF0 precede or lead falling edges of the external clock signal XCLK by a predetermined amount.

The command decoder 26 has an input XCMD for accepting commands from circuitry external to the DDR DRAM 10, such as the processor 22 of FIG. 1, and has an output READ for providing read commands to the burst counter 28 and the QED0 generator circuit 30. The command decoder 26 also provides latency commands via a latency bus 34. A timing circuit 36 provides a set of timing signals on a timing bus 38. An input to the timing circuit 36 is coupled to the output CLK_DQ from the delay-locked loop 32. The timing circuit 36 includes a delay element 40 and an inverter 42. The delay element 40 has an input that is coupled to the output CLK_DQ from the delay-locked loop 32 and has an output that is coupled to an inverter 42.

The timing circuit 36 also includes five transparent latches 50, 52, 54, 56 and 58, each having a data input D, a data output Q and latching inputs LAT and LAT*. Inputs LAT are coupled to the output from the delay element 40 and inputs LAT* are coupled to the output of the inverter 42. The data input D of the latch 50 is coupled to the output QED0 from the QED0 generator 30 and the data output Q of the latch 50 is coupled to the data input D of the latch 52. The latches 52, 54, 56 and 58 are coupled in cascade, with the data input D of each being coupled to the data output Q of the preceding latch.

As a result, a series of timing signals Q0, Q1, 1$h$, Q2, 2$h$ and Q3 are provided on the timing bus 38. The timing signals Q0–Q3 are respectively delayed by one-half clock cycle from the preceding timing signal in response to the QED0 generator 30 providing the timing signal QED0. Each of the series of timing signals Q0–Q3 goes to logic "1" one-half clock cycle after the preceding timing signal goes to logic "1", and returns to logic "0" one-half clock cycle after the preceding timing signal returns to logic "0".

As a result, when the signal QED0 presents a pulse of logic "1" having a predetermined length, respective timing signals Q0–Q3 also presents a pulse of logic "1" having the predetermined length but delayed one-half clock cycle with respect to the preceding timing signal. The series of timing signals Q0–Q3 is used together with latency commands to generate output timing signals, as is discussed below in more detail with respect to FIGS. 3–7.

A timing generator 60 is coupled to the latency bus 34 and to the timing bus 38 and has outputs QED, QES and QS0. A data output driver DQ DRIVER 62 has an input coupled to the output QED and an output data strobe driver DQS DRIVER 64 has inputs coupled to the outputs QES and QS0. The output QED enables data DQ to be output from the DDR DRAM 10 of FIG. 1, and the data strobe output QES enables output data strobe signals DQS to be output from the DDR DRAM 10.

Figure 3:
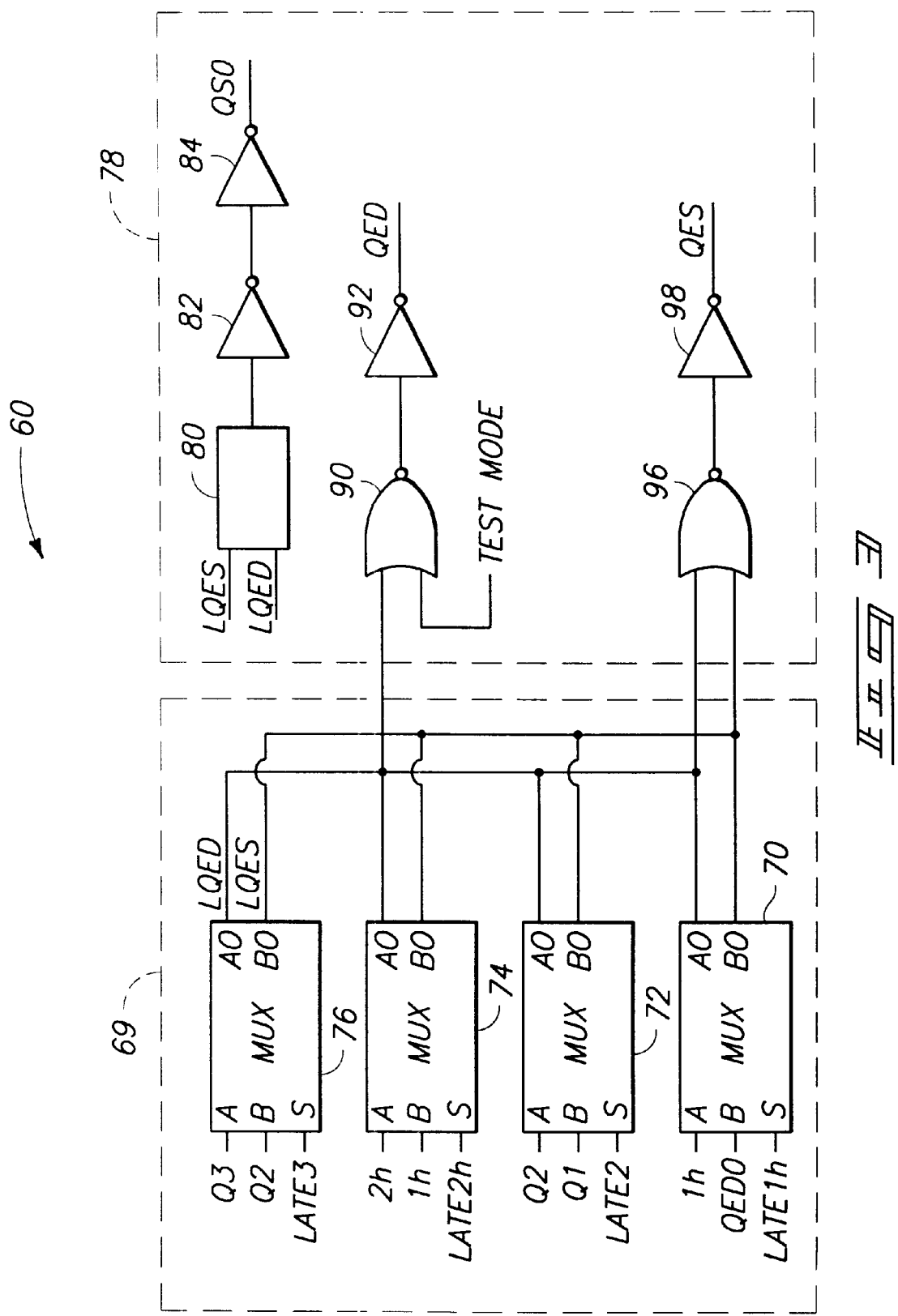
FIG. 3 is a simplified schematic diagram of an embodiment of the timing generator of FIG. 2, in accordance with an embodiment of the present invention.

FIG. 3 is a simplified schematic diagram of an embodiment of the timing generator 60 of FIG. 2, in accordance with an embodiment of the present invention. The timing generator 60 includes a latency selection circuit 69. The latency selection circuit 69 includes multiplexers MUX 70, 72, 74 and 76, respectively having data inputs A and B, a select input S and data outputs AO and BO.

The data outputs AO of the multiplexers MUX 70, 72, 74 and 76 are all coupled together and provide a data enable signal LQED. The data outputs BO of the multiplexers MUX 70, 72, 74 and 76 are all coupled together and provide a data strobe enable signal LQES. Each of the select inputs S of the multiplexers MUX 70, 72, 74 and 76 is coupled to a respective latency select signal LATE1$h$, LATE2, LATE2$h$ and LATE3 from the latency bus 34 and only one of the latency select signals is asserted at any one time. As a result, only one of the multiplexers MUX 70, 72, 74 or 76 is active at any one time, and this determines the number of clock cycles after a data read command before data are output from the DDR DRAM 10 of FIG. 1.

In one embodiment, the data inputs A and B of the multiplexers MUX 70, 72, 74 and 76 are coupled to timing signals from the timing circuit 36 of FIG. 2 as shown in FIG. 3. Other arrangements are possible for implementation of other latencies.

The timing generator 60 also includes a control signal generator 78. The control signal generator 78 includes a one shot circuit 80 and inverters 82 and 84. The one shot circuit 80 has inputs that are coupled to the signals LQES and LQED from the multiplexers MUX 70, 72, 74 and 76 and has an output that is coupled to an input to the inverter 82. The inverter 82 has an output that is coupled to an input to the inverter 84. An output from the inverter 84 provides the output signal QS0. The output signal QS0 is used to generate a preamble portion of the data output strobe signal DQS, as is discussed below in more detail with reference to FIGS. 5 through 7.

The timing generator 60 also includes a NOR gate 90 and an inverter 92. The NOR gate 90 has one input that is coupled to the signal LQED and another input that is coupled to a signal TEST MODE. The signal TEST MODE is normally logic "0" so that the NOR gate 90 normally acts as an inverter. An output of the NOR gate 90 is coupled to an input to the inverter 92. An output of the inverter 92 provides the signal QED that enables the data signal output.

The timing generator 60 also includes a NOR gate 96 and an inverter 98. The NOR gate 96 has one input coupled to the signal LQED and another input that is coupled to the signal LQES. An output of the NOR gate 96 is coupled to an input to the inverter 98. An output of the inverter 98 provides the signal QES that enables the data strobe signal output.

The number of elements (e.g., gates, inverters and the like) that are coupled between the multiplexers MUX 70–76 and the output signals QS0, QED and QES must be matched in order to maintain substantially identical delays along the paths for the various output signals. By forming the paths using similar elements having similar delay behavior over temperature, the delays remain matched as an operating temperature of the DDR DRAM 10 of FIG. 1 varies.

Figure 4:
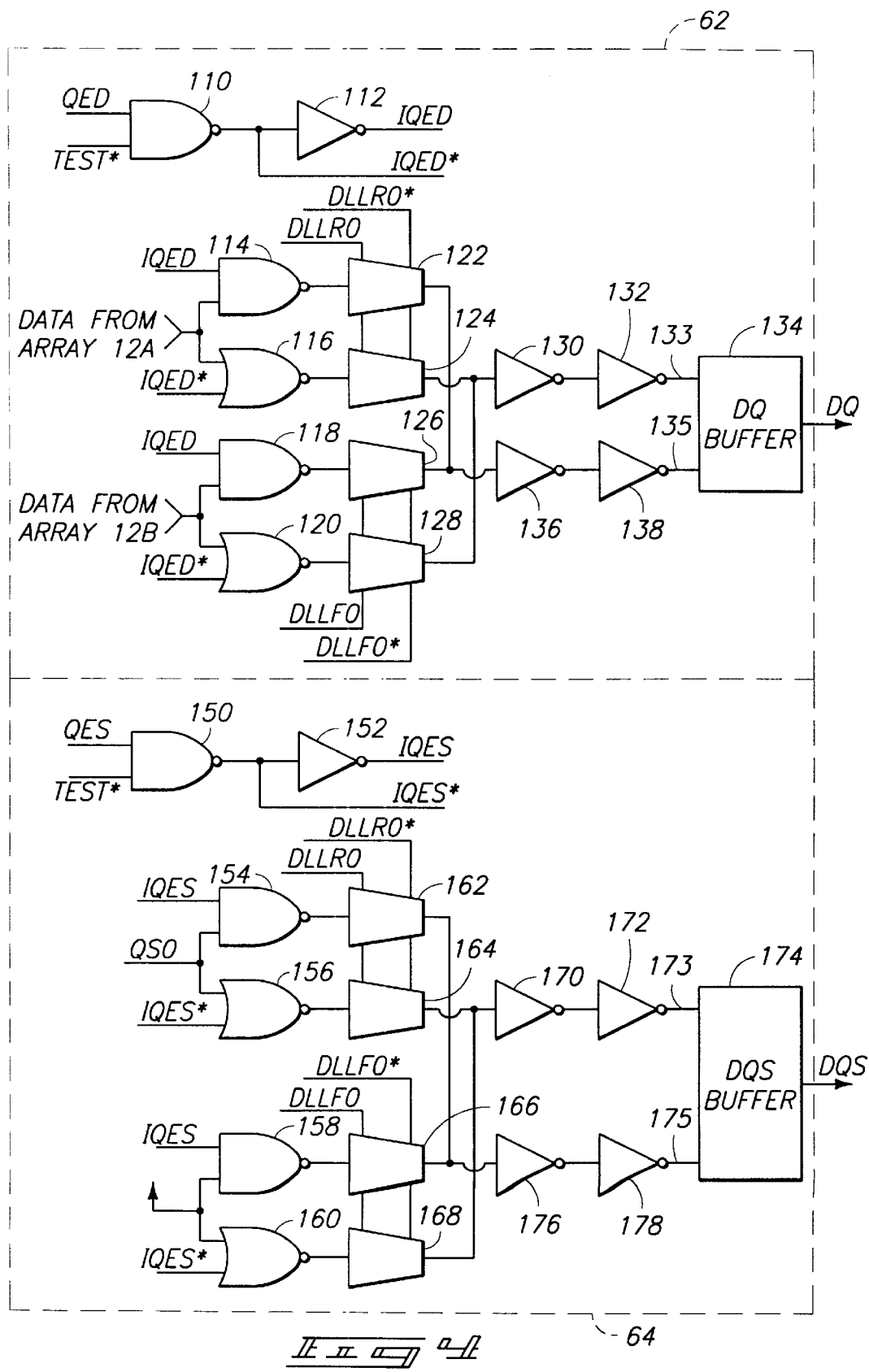
FIG. 4 is a simplified schematic diagram of an embodiment of the output drivers of FIG. 2, in accordance with an embodiment of the present invention.

FIG. 4 is a simplified schematic diagram of an embodiment of the data and data strobe output drivers 62 and 64 of FIG. 2, in accordance with an embodiment of the present invention. The data output driver 62 includes a NAND gate 110 and an inverter 112. The NAND gate 110 has one input that is coupled to the signal QES from the timing generator 60 of FIG. 3 and has another input that is coupled to a signal TEST*. An input to the inverter 112 is coupled to an output of the NAND gate 110. The output of the NAND gate 110 provides a timing signal IQED* and an output of the inverter 112 provides a complementary timing signal IQED.

The data output driver 62 also includes a NAND gate 114 and a NOR gate 116. The NAND gate 114 has one input coupled to the signal IQED and another input coupled to data from the array 12A of FIG. 1. The NOR gate 116 has one input coupled to the data from the array 12A and another input coupled to the signal IQED*.

The data output driver 62 also includes a NAND gate 118 and a NOR gate 120. The NAND gate 118 has one input coupled to the signal IQED and another input coupled to data from the array 12B of FIG. 1. The NOR gate 120 has one input coupled to the data from the array 12B and another input coupled to the signal IQED*.

The data output driver 62 also includes a first set of multiplexers 122 and 124 and a second set of multiplexers 126 and 128. The first set of multiplexers 122 and 124 are clocked by signals DLLR0 and DLLR0* from the delay-locked loop 32 of FIG. 2, and the second set of multiplexers 126 and 128 are clocked by signals DLLF0 and DLLF0* from the delay-locked loop 32. For latencies that are an integral number of clock periods, rising edges of the signals DLLR0 and DLLR0* are timed to precede rising edges of the external clocking signal XCLK and rising edges of the signals DLLF0 and DLLF0* are timed to precede falling edges of the signal XCLK. For latencies that are not an integral number of clock periods, rising edges of the signals DLLR0 and DLLR0* are timed to precede falling edges of the external clocking signal XCLK and rising edges of the signals DLLF0 and DLLF0* are timed to precede rising edges of the signal XCLK.

An output of the NAND gate 114 is coupled to a data input of the multiplexer 122 and an output of the NOR gate 116 is coupled to a data input of the multiplexer 124. Similarly, an output of the NAND gate 118 is coupled to a data input of the multiplexer 126 and an output of the NOR gate 120 is coupled to a data input of the multiplexer 128.

The data output driver 62 also includes inverters 130 and 132, a DQ buffer 134 having inputs 133 and 135 and inverters 136 and 138. Outputs of the multiplexers 122 and 126 are coupled together and to an input to the inverter 130. An output of the inverter 130 is coupled to an input of the inverter 132. An output of the inverter 132 is coupled to the first input 133 to the DQ buffer 134. Similarly, outputs of the multiplexers 124 and 128 are coupled to an input to the inverter 136. An output of the inverter 136 is coupled to an input to the inverter 138. An output of the inverter 138 is coupled to the input 135 to the DQ buffer 134.

The data strobe output driver 64 is similar to the data output driver 62. The data strobe output driver 64 includes a NAND gate 150, an inverter 152, a NAND gate 154, a NOR gate 156, a NAND gate 158, A NOR gate 160, multiplexers 162, 164, 166 and 168, inverters 170 and 172, a DQS buffer 174 having inputs 173 and 175 and inverters 176 and 178.

The NAND gate 150 and the inverter 152 generate timing signals IQES and IQES* from signals QES and TEST*. The NAND gate 154 and the NOR gate 156 each have one input that is coupled to the signals IQES and IQES*, respectively, and each have another input that is coupled to the signal QS0. The NAND gate 158 and the NOR gate 160 each have one input that is coupled to the signals IQES and IQES*, respectively, and each have another input that is coupled to logic "1". Outputs of the gates 154 and 156 are coupled to data inputs to multiplexers 162 and 164, respectively, and outputs of the gates 158 and 160 are coupled to data inputs to multiplexers 166 and 168, respectively.

In response to clocking signals DLLR0 and DLLF0 from the delay-locked loop 32 of FIG. 2, output signals are coupled from the multiplexers 164 and 168 through inverters 170 and 172 to the first input 173 to the DQS buffer 174. Similarly, output signals are coupled to the complementary input 175 to the DQS buffer 174 from the multiplexers 162 and 166 through the inverters 176 and 178.

Figure 5:
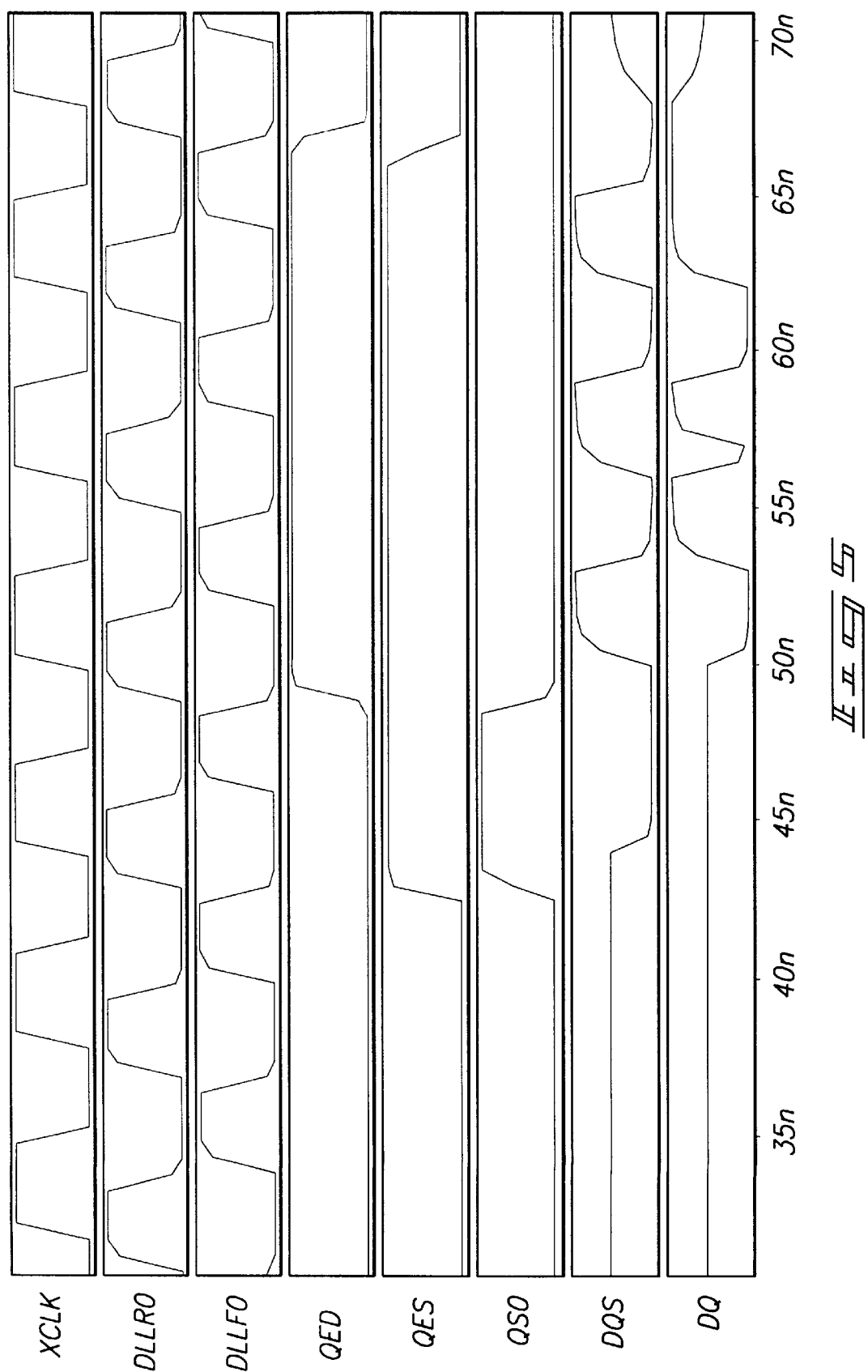
FIG. 5 is a simplified timing diagram showing a latency three, burst length four data output operation, in accordance with an embodiment of the present invention.
Figure 6:
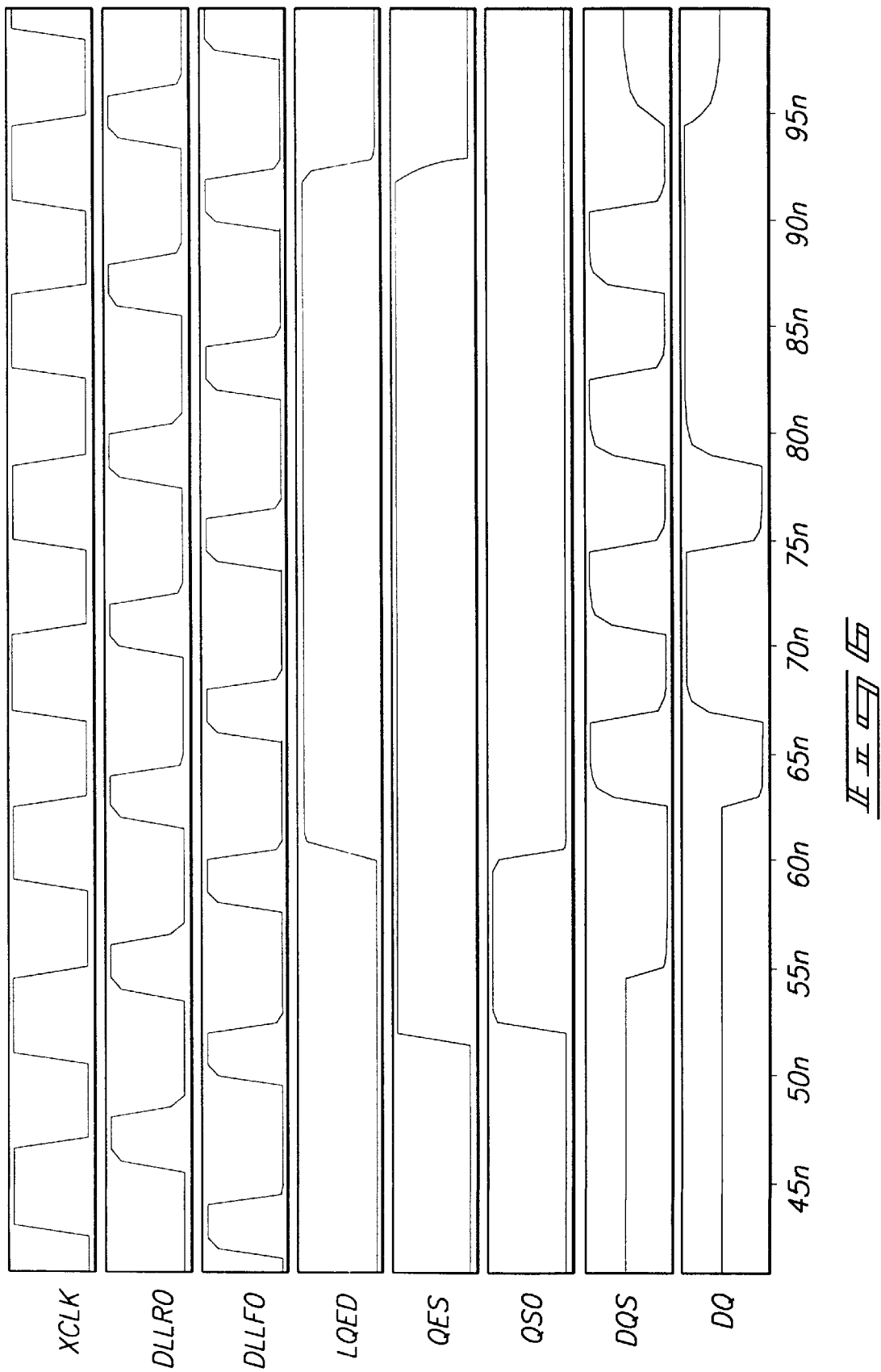
FIG. 6 is a simplified timing diagram showing a latency two and one-half, burst length eight data output operation, in accordance with an embodiment of the present invention.

FIG. 5 is a simplified timing diagram showing a latency three, burst length four data output operation, in accordance with an embodiment of the present invention. Eight signals are shown in FIGS. 5 and 6, labeled (top to bottom) XCLK, DLLR0, DLLF0, QED (FIG. 5) or LQED (FIG. 6), QES, QS0, DQS and DQ. The external clock signal XCLK of FIG. 2 is shown in the top trace.

Rising edges of the delay-locked loop output signal DLLR0, shown below the external clock signal XCLK, lead rising edges of the external clock signal XCLK by about 8 nanoseconds. Similarly, rising edges of the delay-locked loop output signal DLLF0 lead falling edges of the external clock signal XCLK. This allows the multiplexers 122–128 of FIG. 4 to pass data to the DQ buffer 134 and thus to the I/O bus 20 of FIG. 1, without desynchronization of the data output with respect to the external clock signal XCLK.

For the latency three, burst length four data output operation of FIG. 5, the LATE3 signal is asserted (i.e., set to logic "1") by the command decoder 26 of FIG. 2, allowing only the multiplexer 76 of FIG. 3 to pass the timing signals Q3 and Q2 to form the signals LQED and LQES, respectively. The signal LQED needs to change to logic "1" following a falling edge of DLLF0 and also needs to have completed changing to logic "1" prior to a next rising edge of DLLR0, in order for data from the arrays 12A and 12B to be synchronized with clocking signals DLLR0 and DLLF0 in the multiplexers 122, 124, 126 and 128.

The one-shot 80 of FIG. 3 generates the signal QS0 from the signals LQES and LQED. The signal QS0 then is used by the gates 154 and 156 (FIG. 4) in the DQS driver 64 (FIGS. 3 and 4) to generate a logic "0" preamble portion of the signal DQS from the output of the DQS driver 64, which has a high impedance quiescent state. As a result, the signal DQS at the output of the DQS driver 64 of FIG. 4 changes from a signal level of about 1.4 volts in the quiescent state to a logic "0" shortly after the signal QS0 fires to logic "1".

One clock cycle later, and in synchronism with the rising edge of the fourth cycle of the external clock signal XCLK, data signals DQ from the output of the DQ buffer 134 of FIG. 4 and data strobe signals DQS from the output of the data strobe buffer 174 begin to be output from the DDR DRAM 10 (FIG. 1). When the burst of two bytes from each of the arrays 12A and 12B (FIG. 1) has been clocked out of the DQ buffers 134 (FIG. 4), the DQ and DQS signals both return to the quiescent, high impedance state in synchronism with the rising edge of the seventh cycle of the external clock signal XCLK.

FIG. 6 is a simplified timing diagram showing a latency two and one-half, burst length eight data output operation, in accordance with an embodiment of the present invention. The LATE2*h* signal is asserted by the command decoder 26 of FIG. 2, allowing only the multiplexer 74 of FIG. 3 to pass the timing signals 2*h* and 1*h* to form the signals LQED and LQES, respectively. The one-shot 80 of FIG. 3 generates the signal QS0 from the signals LQES and LQED, and the signal QS0 is used to generate the DQS preamble, as described with reference to FIG. 5, but with the preamble of the DQS signal starting on the falling edge of the second cycle of the external clock signal XCLK.

One clock cycle later, and in synchronism with the falling edge of the third cycle of the external clock signal XCLK (i.e., after two and one-half clock cycles), data DQ is clocked from the output of the DQ buffer 134 of FIG. 4 out of the DDR DRAM 10 (FIG. 1). When the burst of eight bytes, four from each of the arrays 12A and 12B (FIG. 1), has been clocked out of the DQ buffers 134 (FIG. 4) at the rising edge of the seventh cycle of the external clock signal XCLK, the DQ and DQS signals both return to the quiescent, high impedance state in synchronism with the falling edge of the seventh cycle of the external clock signal XCLK.

FIG. 7 is a simplified timing diagram showing a latency two, burst length eight data output operation, in accordance with an embodiment of the present invention. Eight signals are shown in FIG. 7, labeled (top to bottom) XCLK, DLLR0, DLLF0, QES, QED, QS0, DQS and DQ.

The LATE2 signal is asserted by the command decoder 26 of FIG. 2, allowing only the multiplexer 72 of FIG. 3 to pass the timing signals Q2 and Q1 to form the signals LQED and LQES, respectively. The signal QS0 is formed and used to generate the DQS preamble as described above with reference to FIG. 5, but with the preamble starting on the rising edge of the second cycle of the external clock signal XCLK.

One clock cycle later, and in synchronism with the rising edge of the third cycle of the external clock signal XCLK, data DQ is clocked from the output of the DQ buffer 134 of FIG. 4 out of the DDR DRAM 10 (FIG. 1). When the burst of four bytes from each of the arrays 12A and 12B (FIG. 1) has been clocked out of the DQ buffers 134 (FIG. 4) at the falling edge of the sixth cycle of the external clock signal XCLK, the DQ and DQS signals both return to the quiescent, high impedance state in synchronism with the rising edge of the seventh cycle of the external clock signal XCLK.

The examples of FIGS. 5 through 7 use a preamble having a length of one clock cycle. When a preamble having a length of one-half clock cycle is needed, the input Q2 to the multiplexer 76 of FIG. 3 may be replaced by the signal 2*h*, the input 1*h* to the multiplexer 74 may be replaced by the signal Q2, the input Q1 to the multiplexer 72 may be replaced by the signal 1*h* and the input QED0 to the multiplexer 70 may be replaced by Q1. Other preamble lengths may be selected by suitable choices of timing signals for the multiplexers 70, 72, 74 and 76.

Key to all of the data output operations of FIGS. 5 through 7 is that signals DLLR0 and DLLF0 for clocking data through the multiplexers 122–128 and 162–168 (FIG. 4) are derived from the delay-locked loop 32 of FIG. 2, rather than from traditional clock signal sources. This is advantageous because the signals DLLR0 and DLLF0 from the delay-locked loop 32 have a predetermined phase relationship with the external clocking signal XCLK. As a result, signals clocked by the signals DLLR0 and DLLF0 are valid during the much more stringent timing windows needed for double data rate operation and thus for implementation of higher clock frequencies.

Deriving the timing signals Q1, 1h, Q2, 2h and Q3 from outputs from the delay-locked loop 32 permits these timing signals to be valid during the much narrower timing windows required for DDR DRAM operation. Balancing propagation delays for the timing signals, for generation and propagation of the control signals QES, QED, QS0 and for generation of the signals DQ and DQS, facilitates synchronization of the DQ and DQS signals and provides robust temperature tracking of the synchronization.

The timing generator 69 and control signal generator 78 of FIG. 3 provide a simple but robust way of obtaining these benefits and of providing input signals to the data output driver 62 and the data strobe output driver 64 of FIGS. 2 and 4. In one embodiment, by ensuring that the number of gates in each signal path is the same and that the fixed delays are chosen properly, and by using the timing signals DLLR0 and DLLF0 from the delay-locked loop 32 of FIG. 2, increased data output rates are achieved together with more stringent timing constraints relative to the external clocking signal XCLK.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. An output circuit for a double data rate dynamic random access memory comprising:
    a delay-locked loop having an input configured to accept an external clock signal, the delay-locked loop providing a first internal clock signal and a second internal clock signal, the first and second internal clock signals being interleaved and having predetermined timing relationships with the external clock signal; and
    a data strobe circuit coupled to the delay-locked loop, the data strobe circuit being configured to provide a data strobe signal including a preamble, and to synchronize the data strobe signal and preamble with the first and second internal clock signals.

2. The output circuit of claim 1, wherein the data strobe circuit comprises:
    a first pair of multiplexers configured to be clocked by the first of the internal clock signals;
    a second pair of multiplexers configured to be clocked by the second of the internal clock signals; and
    combinatorial logic having inputs coupled to timing signals and having outputs coupled to inputs to the first and second pairs of multiplexers.

3. The output circuit of claim 2, wherein the data strobe circuit further comprises:
    delay equalization circuits having inputs coupled to outputs from the first and second multiplexers and having outputs; and
    an output buffer circuit having complementary inputs coupled to the outputs from the delay equalization circuits and having an output configured to provide a data output strobe signal.

4. The output circuit of claim 1, wherein the delay equalization circuits include combinatorial logic.

5. An output circuit for a double data rate dynamic random access memory comprising:
    a delay-locked loop having an input configured to accept an external clock signal, the delay-locked loop providing a first internal clock signal and a second internal clock signal, the first and second internal clock signals being interleaved and having predetermined timing relationships with the external clock signal;
    a data output circuit configured to accept input data from first and second arrays of memory cells, the data output circuit being coupled to the delay-locked loop and configured to synchronize data from the first and second arrays of memory cells with the first and second internal clock signals; and
    a data strobe circuit coupled to the delay-locked loop, the data strobe circuit being configured to provide a data strobe signal including a preamble, and to synchronize the data strobe signal and preamble with the first and second internal clock signals.

6. The output circuit of claim 5, wherein the data strobe circuit comprises:
    a first pair of multiplexers configured to be clocked by the first of the internal clock signals;
    a second pair of multiplexers configured to be clocked by the second of the internal clock signals;
    combinatorial logic having inputs coupled to timing signals and having outputs coupled to inputs to the first and second pairs of multiplexers;
    delay equalization circuits respectively having inputs coupled to outputs from the first and second multiplexers and having outputs; and
    an output buffer circuit having complementary inputs coupled to the outputs from the delay equalization circuits and having an output configured to provide a data output strobe signal.

7. The output circuit of claim 6 wherein the delay equalization circuits respectively comprise serially coupled inverters.

8. The output circuit of claim 6 wherein the delay equalization circuits respectively comprise a first inverter and a second inverter coupled in series.

9. The output circuit of claim 5, further including a timing generator comprising:
    a group of multiplexers having data inputs, select inputs and data outputs;
    a latency select bus coupling a latency select signal to a respective select input to one of the group of multiplexers to activate a selected one of the group of multiplexers;
    a timing bus configured to provide a series of timing pulses, the series of timing pulses each being delayed by one-half of a clock cycle compared to a next timing pulse in the series, one each of a pair of timing pulses separated by a one clock cycle delay being coupled to respective data inputs of the multiplexers;
    combinatorial logic having inputs respectively coupled to the data outputs from the multiplexers to provide a one clock cycle long pulse for forming a data strobe preamble signal; and combinatorial logic having an input coupled to receive a later of the pair of timing pulses coupled through the selected one of the multiplexers to provide a data strobe enable signal.

10. The output circuit of claim 5, wherein the data output circuit comprises:

a first pair of multiplexers configured to be clocked by the first of the internal clock signals;

a second pair of multiplexers configured to be clocked by the second of the internal clock signals;

combinatorial logic having inputs coupled to timing signals and to a pair of memory cell arrays and having outputs configured to provide data from a first of the pair of memory cell arrays to inputs to the first pair of multiplexers and configured to provide data from a second of the pair of memory cell arrays to the second pair of multiplexers;

delay equalization circuits having inputs coupled to outputs from the first and second pairs of multiplexers and having outputs; and an output buffer circuit having complementary inputs coupled to the outputs from the delay equalization circuits and having an output alternately providing data from the first and second memory cell arrays.

11. The output circuit of claim 5, wherein the data output circuit is configured to alternately provide data from the first and second memory cell arrays during respective cycles of the data strobe signal.

12. A double data rate dynamic random access memory (DDR DRAM) comprising:

a first array of memory cells arranged in rows and columns;

a second array of memory cells arranged in rows and columns;

a row decoder coupled to rows of the first and second arrays of memory cells;

a column decoder coupled to columns of the first and second arrays of memory cells;

an I/O bus coupled to pins of the memory and to the row and column decoders, the I/O bus coupling data, addresses and commands between the memory and external digital circuitry;

sense amplifiers coupled to the first and second arrays of memory cells; and an output circuit including a data output circuit and a data strobe circuit, the output circuit having inputs coupled to the sense amplifiers and having outputs coupled to the I/O bus, the data output circuit being configured to accept input data from the first and second arrays of memory cells and supply a data burst, the data burst alternately including data from the first and second arrays of memory cells during each cycle of a data strobe signal from the data strobe circuit, the data burst being preceded by a preamble from the data strobe circuit.

13. The DDR DRAM of claim 12, wherein the output circuit further comprises a delay locked loop configured to supply first and second interleaved internal clock signals, and wherein the data output circuit is configured to supply data from the first array of memory cells in response to the first internal clock signal and supplies data from the second array of memory cells in response to the second internal clock signal.

14. The DDR DRAM of claim 13, wherein the data output circuit and the data strobe circuit respectively include:

a first pair of multiplexers clocked by the first of the internal clock signals;

a second pair of multiplexers clocked by the second of the internal clock signals;

combinatorial logic having inputs coupled to timing signals and having outputs coupled to inputs to the first and second pairs of multiplexers;

a pair of delay equalization circuits having inputs coupled to outputs from the first and second multiplexers and having outputs; and an output buffer circuit having complementary inputs coupled to the outputs from the delay equalization circuits and having an output configured to provide an output signal.

15. The DDR DRAM of claim 12, further comprising:

timing circuitry including a pulse generator providing a pulse and a chain of transparent latches configured to provide a series of pulses in response to the pulse, each latch in the chain providing a pulse that is delayed one-half of a clock cycle relative to a pulse from an immediately preceding transparent latch; and latency selection circuitry responsive to latency commands to select a data output latency, the latency selection circuitry selecting one of a plurality of multiplexers to couple timing signals from pairs of the transparent latches, wherein the data strobe circuit provides a preamble in response to the timing signals from one of the plurality of multiplexers.

16. A method of clocking data out from a double data rate dynamic random access memory comprising:

providing a data enable signal after a falling edge of a first internal clock signal and prior to a rising edge of a second internal clock signal, the first and second internal clock signals being interleaved;

coupling first data from a first data array through first combinatorial logic in response to the data enable signal;

clocking the first data through a first multiplexer with the first internal clocking signal;

coupling second data from a second data array through second combinatorial logic in response to the data enable signal;

clocking the second data through a second multiplexer with the second clocking signal;

coupling the first and second data from the first and second multiplexers to a data buffer; and providing a data strobe signal to a data strobe buffer, the data strobe signal being synchronized with the first and second data and with the external clock signal.

17. The method of claim 16, wherein coupling the first and second data to a data buffer includes coupling the first and second data through logical elements to provide a predetermined amount of delay.

18. The method of claim 16, further comprising:

deriving the first internal clock signal from an external clock signal using a delay-locked loop, the first internal clock signal having a rising edge leading a rising edge of the external clock signal when a latency of an integer number of clock cycles is selected; and deriving the second internal clock signal from the external clock signal using the delay-locked loop, the second internal clock signal having a rising edge leading a falling edge of the external clock signal when a latency of an integer number of clock cycles is selected.

19. The method of claim 16, wherein providing a data strobe signal comprises:

providing a data strobe enable signal after the falling edge of the first internal clock signal and before the rising edge of the second internal clock signal;

clocking the data strobe enable signal through a third multiplexer with the first internal clocking signal to provide a first phase of the data strobe signal;

clocking the data strobe enable signal through a fourth multiplexer with the second clocking signal to provide a second phase of the data strobe signal; and coupling the first and second phases of the data strobe signal from the third and fourth multiplexers to a data strobe buffer to provide the data strobe signal to a data strobe buffer, the data strobe signal being synchronized with the first and second data and having a predetermined relationship with the external clock signal.

20. The method of claim 19 further comprising:

coupling the data enable signal to a first input to a one-shot circuit;

coupling the data strobe enable signal to a second input to the one-shot circuit;

generating a pulse having a pulse width of one clock cycle by the one-shot circuit when the data strobe enable signal and the data enable signals have different logical states;

coupling the pulse through logical elements to provide a predetermined amount of delay; and coupling the pulse from the logical elements to the data strobe buffer to provide a preamble for the data strobe signal.

21. A method of providing a data strobe signal comprising:

providing a data strobe enable signal after a falling edge of a first internal clock signal and prior to a rising edge of a second internal clock signal, the first and second internal clock signals being interleaved;

clocking the data strobe enable signal through a first multiplexer with the first internal clocking signal to provide a first phase of the data strobe signal;

clocking the data strobe enable signal through a second multiplexer with the second clocking signal to provide a second phase of the data strobe signal; and coupling the first and second phases of the data strobe signal from the first and second multiplexers to a data strobe buffer to provide the data strobe signal to a data strobe buffer, the data strobe signal being synchronized with the first and second data and with the external clock is signal.

22. The method of claim 21 further comprising:

coupling the data enable signal to a first input to a one-shot circuit;

coupling the data strobe enable signal to a second input to the one-shot circuit;

generating a pulse having a pulse width of one clock cycle by the one-shot circuit when the data strobe enable signal and a data enable signals have different logical states;

coupling the pulse through logical elements to provide a predetermined amount of delay; and coupling the pulse from the logical elements to the data strobe buffer to provide a preamble for the data strobe signal.

23. The method of claim 20, further comprising:

deriving the first internal clock signal from an external clock signal using a delay-locked loop, the first internal clock signal having a rising edge leading a rising edge of the external clock signal when a latency of an integer number of clock cycles is selected; and deriving the second internal clock signal from the external clock signal using the delay-locked loop, the second internal clock signal having a rising edge leading a falling edge of the external clock signal when a latency of an integer number of clock cycles is selected.

24. The method of claim 20, further comprising:

deriving the first internal clock signal from an external clock signal using a delay-locked loop, the first internal clock signal having a rising edge leading a falling edge of the external clock signal when a latency of a non-integer number of clock cycles is selected; and deriving the second internal clock signal from the external clock signal using the delay-locked loop, the second internal clock signal having a rising edge leading a rising edge of the external clock signal when a latency of a non-integer number of clock cycles is selected.

* * * * *

UNITED STATES PATENT AND TRADEMARK OFFICE
CERTIFICATE OF CORRECTION

PATENT NO.   : 6,240,042 B1
DATED        : May 29, 2001
INVENTOR(S)  : Wen Li

It is certified that error appears in the above-identified patent and that said Letters Patent is hereby corrected as shown below:

Column 2,
Line 24, replace "failing" with -- falling --.

Column 14,
Line 22, replace "20" with -- 21 --.
Line 33, replace "20" with -- 21 --.

Signed and Sealed this

Fifteenth Day of January, 2002

Attest:

Attesting Officer

JAMES E. ROGAN
Director of the United States Patent and Trademark Office